(12) United States Patent
Chen et al.

(10) Patent No.: US 9,935,130 B2
(45) Date of Patent: Apr. 3, 2018

(54) PIXEL STRUCTURE AND LIQUID CRYSTAL DISPLAY COMPRISING THE PIXEL STRUCTURE

(71) Applicant: Shenzhen China Star Optoelectronics Technology Co., Ltd., Shenzhen, Guangdong (CN)

(72) Inventors: Cheng-Hung Chen, Guangdong (CN); Tien-Hao Chang, Guangdong (CN); Jinbo Guo, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 14/431,047

(22) PCT Filed: Dec. 23, 2014

(86) PCT No.: PCT/CN2014/094684
§ 371 (c)(1),
(2) Date: Mar. 25, 2015

(87) PCT Pub. No.: WO2016/095247
PCT Pub. Date: Jun. 23, 2016

(65) Prior Publication Data
US 2016/0171946 A1    Jun. 16, 2016

(30) Foreign Application Priority Data

Dec. 16, 2014  (CN) .......................... 2014 1 0783882

(51) Int. Cl.
*G09G 3/20* (2006.01)
*H01L 27/12* (2006.01)
(Continued)

(52) U.S. Cl.
CPC ...... *H01L 27/124* (2013.01); *G02F 1/134309* (2013.01); *G02F 1/136286* (2013.01);
(Continued)

(58) Field of Classification Search
CPC .. G09G 3/3648; G09G 3/3688; G09G 3/2074; G09G 2310/027;
(Continued)

(56) References Cited

U.S. PATENT DOCUMENTS

2005/0231671 A1* 10/2005 Jun ........................ G02F 1/1393
349/139
2010/0123845 A1* 5/2010 Kim ....................... H01L 27/124
349/46

(Continued)

FOREIGN PATENT DOCUMENTS

CN    101398587 A    4/2009
CN    101706635 A    5/2010
(Continued)

*Primary Examiner* — Matthew Sim
(74) *Attorney, Agent, or Firm* — Andrew C. Cheng

(57) ABSTRACT

A pixel structure includes pixel electrodes, data lines, and gate lines. Each of the pixel electrodes has two opposite ends that are each provided with one of the gate lines. The data lines and the gate lines re perpendicular to each other. Each of the pixel electrodes includes at least two sub-pixel domains. The data lines are located beneath the pixel electrode at interfacing between every two adjacent ones of the sub-pixel domains. The pixel electrodes each include slits located in the interfacing of the two adjacent sub-pixel domains. The slits are in alignment with the data line and located above the data line. Also provided is a liquid crystal display. The pixel structure and a liquid crystal display including the pixel structure have a reduced overlapping area between the data line and the pixel electrode above the data line so as to reduce parasitic capacitance and improve V-crosstalk.

16 Claims, 9 Drawing Sheets

(51) Int. Cl.
     *G02F 1/1343*  (2006.01)
     *G02F 1/1362*  (2006.01)
     *G09G 3/36*    (2006.01)
     *G02F 1/1337*  (2006.01)

(52) U.S. Cl.
     CPC ...... *G02F 1/133707* (2013.01); *G09G 3/3611* (2013.01); *G09G 2300/0426* (2013.01); *G09G 2320/0209* (2013.01)

(58) Field of Classification Search
     CPC ... G09G 2300/0426; G09G 2320/0209; G09G 2300/0452; H01L 27/124
     See application file for complete search history.

(56) References Cited

U.S. PATENT DOCUMENTS

| | | | |
|---|---|---|---|
| 2012/0050656 A1* | 3/2012 | Liu | G02F 1/1343 349/139 |
| 2015/0200211 A1* | 7/2015 | Hong | H01L 27/1248 349/43 |

FOREIGN PATENT DOCUMENTS

| | | | |
|---|---|---|---|
| CN | 101782703 | A | 7/2010 |
| CN | 102156371 | A | 8/2011 |
| CN | 102375275 | A | 3/2012 |
| CN | 102759833 | A | 10/2012 |
| CN | 202837761 | U | 3/2013 |
| CN | 103543563 | A | 1/2014 |

\* cited by examiner

US 9,935,130 B2

PIXEL STRUCTURE AND LIQUID CRYSTAL DISPLAY COMPRISING THE PIXEL STRUCTURE

CROSS REFERENCE TO RELATED APPLICATIONS

This application claims the priority of Chinese Patent Application No. 201410738882.3, entitled "Pixel Structure and Liquid Crystal Display Comprising the Pixel Structure", filed on Dec. 16, 2014, the disclosure of which is incorporated herein by reference in its entirety.

BACKGROUND OF THE INVENTION

1. Field of the Invention

The present invention relates to the field of liquid crystal displaying, and in particular to a pixel structure and a liquid crystal display comprising the pixel structure.

2. The Related Arts

With the increasing progress of the liquid crystal display technology, liquid crystal displaying devices, such as light emitting diode panels, which serve as a display component, has been widely used in electronic products, such as mobile phones, digital cameras, and personal digital assistants (PDAs). The liquid crystal display panel comprises a pixel structure. Referring to FIG. 1, a schematic view is given to illustrate a conventional pixel structure. The pixel structure 100 is applicable to a liquid crystal displaying device, such as a liquid crystal display. The conventional pixel structure 100 generally comprises a plurality of pixel electrode 10, data lines 20, gate lines 30, and an upper substrate. The data lines 20 are arranged between adjacent pixel electrodes 10 and are perpendicular to the gate lines 30. The upper substrate is provided at locations corresponding to metal wiring, such as the data lines 20 and the gate lines 30, with a black matrix (BM). The black matrix shields light leakage between the data lines 20 and shielding metal. As shown in FIG. 1, each pixel electrode 10 is generally divided by separation electrodes 40 into four domains 50.

In displaying a black-background white-frame image with the pixel structure 100, due to factors, such as panel warpage and positional shift of upper and lower substrates, light leakage may occur around the data line 20 so as to cause V-Crosstalk. Further, since relative positional shift occurs between the upper and lower substrates, an area with a large positional shift would result in a large area of darkness so that the black matrix on the substrate must be expanded in order to shield light leakage. This reduces the aperture ratio of the pixel. To increase the aperture ratio of the pixel, it is common to arranged the data line 20 beneath the separation electrode 40 at the interfacing of the domains 50. However, since in such an arrangement, the data line 20 is completely coincident with the separation electrode 40 of the pixel electrode 100, a relatively high parasitic capacitance would be caused between them. This leads to V-crosstalk in a grey-background white frame image.

SUMMARY OF THE INVENTION

The present invention provides a pixel structure and a liquid crystal display comprising the pixel structure, which help reduce an overlapping area between a data line and a pixel electrode located above the data line, reducing the parasitic capacitance between the data line and the pixel electrode and also reducing loading of the data line, increasing charging rate of the pixel, and alleviating V-crosstalk of a grey-background white-frame image.

In one aspect, the present invention provides a pixel structure, which comprises a plurality of pixel electrodes, a plurality of data lines, and a plurality of gate lines, each of the pixel electrodes having two opposite ends that are each provided with one of the gate lines, the data lines and the gate lines being perpendicular to each other, wherein each of the pixel electrodes comprises at least two sub-pixel domains, the data lines being located beneath the pixel electrode at interfacing between every two adjacent ones of the sub-pixel domains, the pixel electrodes each comprising a plurality of slits located in the interfacing of the two adjacent ones of the sub-pixel domains, the plurality of slits being in alignment with the data line and located above the data line.

In the above pixel structure, the pixel electrodes each comprise a first sub-pixel domain and a second sub-pixel domain, the first sub-pixel domain and the second sub-pixel domain being symmetric with respect to the data line, the first sub-pixel domain and the second sub-pixel domain being each formed with a plurality of slits, the plurality of slits dividing each of the sub-pixel domains into a plurality of separated tabs, the plurality of slits and the plurality of separated tabs being arranged and distributed alternately.

In the above pixel structure, the slits of the first sub-pixel domain and the corresponding slits of the second sub-pixel domain are jointed to and in communication with each other at locations above the data line and are symmetric with respect to the data line, the separated tabs of the first sub-pixel domain being connected to the corresponding separated tabs of the second sub-pixel domain at locations above the data line and being symmetric with respect to the data line, interfacing between the first sub-pixel domain and the second sub-pixel domain that is above the data line being formed of alternately arranged slits that have a predetermined width and are equally spaced.

In the above pixel structure, the plurality of slits has identical open width and the plurality of separated tabs has identical width, the plurality of slits and the plurality of separated tabs being arranged and distributed alternately and in an equally spaced manner.

In the above pixel structure, the separated tabs of the first sub-pixel domain are disconnected from the corresponding separated tabs of the second sub-pixel domain at locations above the data line, the pixel electrode that is located above the data line comprising strip-like openings formed therein and extending in a lengthwise direction of the data line so as to reduce overlapping area between the data line and the pixel electrode located above the data line.

In the above pixel structure, the pixel structure further comprises a plurality of pixel common electrodes, the pixel electrode having another two opposite ends each provided with one of the pixel common electrodes, each of the pixel common electrodes having two opposite ends that are spaced from the gate lines by a predetermined distance, imaginary extension lines of the pixel common electrodes being perpendicular to the gate lines.

In the above pixel structure, the gate line is on the same metal layer as a material that makes the pixel common electrodes, the pixel common electrodes located at the two opposite ends of the pixel electrode being both parallel to the data line and symmetric with respect to an axis of the data line, the pixel common electrodes being located beneath the pixel electrode.

In the above pixel structure, the pixel structure further comprises a plurality of pixel common electrodes, the pixel electrode having another two opposite ends each provided with one of the pixel common electrodes, each of the pixel common electrodes having two opposite ends that are spaced from the gate lines by a predetermined distance, imaginary extension lines of the pixel common electrodes being perpendicular to the gate lines.

In the above pixel structure, a material that makes the pixel common electrodes is not on the same metal layer as the gate line, the pixel common electrodes extending across the gate lines and partly overlapping the pixel electrode, the pixel common electrodes located at the two opposite ends of the pixel electrode being both parallel to the data line and symmetric with respect to an axis of the data line, the pixel common electrodes being located beneath the pixel electrode.

In the above pixel structure, when the interfacing between the first sub-pixel domain and the second sub-pixel domain above the data line comprises the slits or is formed with the openings extending in the lengthwise direction of the data line, the pixel structure is not color filter on array and color resists are formed on a color filter side of an upper substrate; or the pixel structure is not color filter on array and color resists are formed on a thin-film transistor side of a lower substrate.

In another aspect, the present invention provides a liquid crystal display, which comprises: a gate driving circuit, which generates a gate signal; a data driving circuit, which generates a grey level signal; and a pixel structure, which comprises a plurality of pixel electrodes, a plurality of data lines, and a plurality of gate lines, the gate lines being electrically connected to the gate driving circuit to transmit the gate signal, the data lines being electrically connected to the data driving circuit to transmit the grey level signal, the pixel electrode being operable to drive a pixel in response to the grey level signal; wherein each of the pixel electrodes has two opposite ends that are each provided with one of the gate lines, the data lines and the gate lines being perpendicular to each other, each of the pixel electrodes comprising at least two sub-pixel domains, the data lines being located beneath the pixel electrode at interfacing between every two adjacent ones of the sub-pixel domains, the pixel electrodes each comprising a plurality of slits located in the interfacing of the two adjacent ones of the sub-pixel domains, the plurality of slits being in alignment with the data line and located above the data line.

In the above liquid crystal display, the pixel electrodes each comprise a first sub-pixel domain and a second sub-pixel domain, the first sub-pixel domain and the second sub-pixel domain being symmetric with respect to the data line, the first sub-pixel domain and the second sub-pixel domain being each formed with a plurality of slits, the plurality of slits dividing each of the sub-pixel domains into a plurality of separated tabs, the plurality of slits and the plurality of separated tabs being arranged and distributed alternately.

In the above liquid crystal display, the slits of the first sub-pixel domain and the corresponding slits of the second sub-pixel domain are jointed to and in communication with each other at locations above the data line and are symmetric with respect to the data line, the separated tabs of the first sub-pixel domain being connected to the corresponding separated tabs of the second sub-pixel domain at locations above the data line and being symmetric with respect to the data line, interfacing between the first sub-pixel domain and the second sub-pixel domain that is above the data line being formed of alternately arranged slits that have a predetermined width and are equally spaced.

In the above liquid crystal display, the plurality of slits has identical open width and the plurality of separated tabs has identical width, the plurality of slits and the plurality of separated tabs being arranged and distributed alternately and in an equally spaced manner.

In the above liquid crystal display, the separated tabs of the first sub-pixel domain are disconnected from the corresponding separated tabs of the second sub-pixel domain at locations above the data line, the pixel electrode that is located above the data line comprising strip-like openings formed therein and extending in a lengthwise direction of the data line so as to reduce overlapping area between the data line and the pixel electrode located above the data line.

In the above liquid crystal display, the pixel structure further comprises a plurality of pixel common electrodes, the pixel electrode having another two opposite ends each provided with one of the pixel common electrodes, each of the pixel common electrodes having two opposite ends that are spaced from the gate lines by a predetermined distance, imaginary extension lines of the pixel common electrodes being perpendicular to the gate lines.

In the above liquid crystal display, the gate line is on the same metal layer as a material that makes the pixel common electrodes, the pixel common electrodes located at the two opposite ends of the pixel electrode being both parallel to the data line and symmetric with respect to an axis of the data line, the pixel common electrodes being located beneath the pixel electrode.

In the above liquid crystal display, the pixel structure further comprises a plurality of pixel common electrodes, the pixel electrode having another two opposite ends each provided with one of the pixel common electrodes, each of the pixel common electrodes having two opposite ends that are spaced from the gate lines by a predetermined distance, imaginary extension lines of the pixel common electrodes being perpendicular to the gate lines.

In the above liquid crystal display, a material that makes the pixel common electrodes is not on the same metal layer as the gate line, the pixel common electrodes extending across the gate lines and partly overlapping the pixel electrode, the pixel common electrodes located at the two opposite ends of the pixel electrode being both parallel to the data line and symmetric with respect to an axis of the data line, the pixel common electrodes being located beneath the pixel electrode.

In the above liquid crystal display, when the interfacing between the first sub-pixel domain and the second sub-pixel domain above the data line comprises the slits or is formed with the openings extending in the lengthwise direction of the data line, the pixel structure is not color filter on array and color resists are formed on a color filter side of an upper substrate; or the pixel structure is not color filter on array and color resists are formed on a thin-film transistor side of a lower substrate.

Compared to the prior art, the embodiments of the present invention provide a pixel structure, in which the interfacing between a first sub-pixel domain and a second sub-pixel domain that is located above a data line are formed of alternately arranged slits of predetermined widths or the pixel electrode located above the data line comprises a strip-like opening formed therein to extend in the lengthwise direction of the data line. Thus, the overlapping area between the data line and the pixel electrode located above the data line is reduced. This reduces parasitic capacitance between the data line and the pixel electrode and also alleviates V-crosstalk of a grey-background white-frame image.

BRIEF DESCRIPTION OF THE DRAWINGS

To more clearly explain the technical solutions proposed in embodiments of the present invention or those of the prior art, a brief description of the drawings that are necessary for describing the embodiments of the present invention or those of the prior art is given as follows. It is obvious that the drawings that will be described below show only some embodiments of the present invention. For those having ordinary skills of the art, other drawings may also be readily available from these attached drawings without the expense of creative effort and endeavor.

DETAILED DESCRIPTION OF THE PREFERRED EMBODIMENTS

Figure 1:
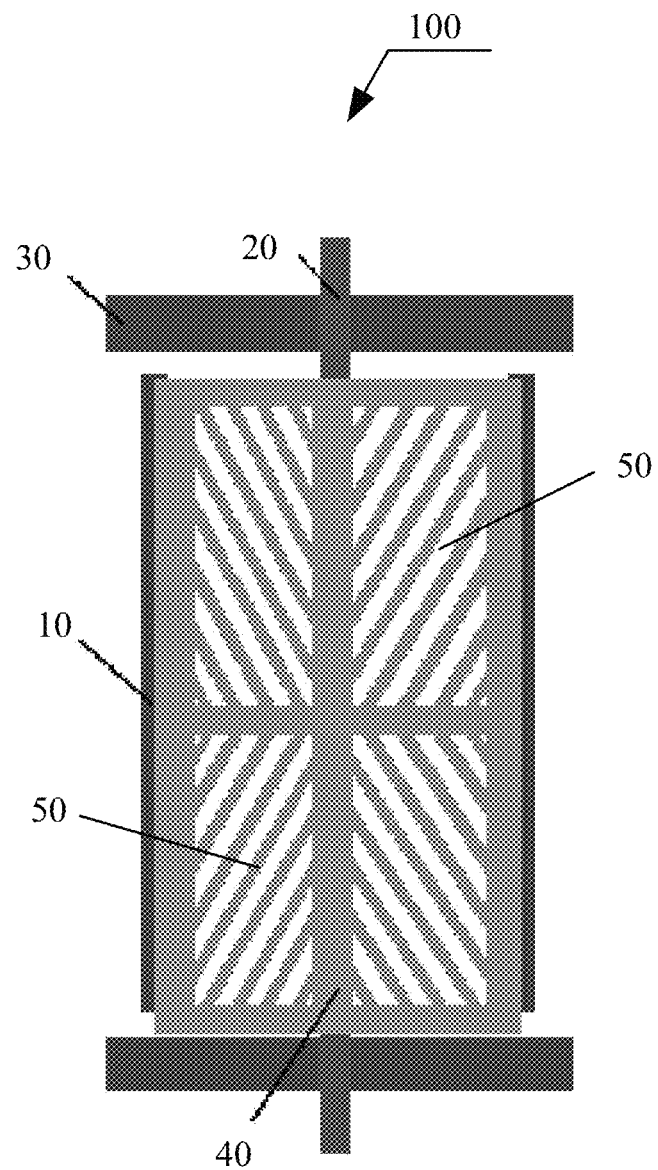
FIG. 1 is a schematic view showing a conventional pixel structure.

A clear and complete description will be given to technical solutions of the embodiments of the present invention with reference to the attached drawings of the embodiments of the present invention. However, the embodiments so described are only some, but not all, of the embodiments of the present invention. Other embodiments that are available to those having ordinary skills of the art without the expense of creative effort and endeavor are considered belonging to the scope of protection of the present invention.

Further, the description given below for the various embodiment is made with reference to the attached drawings to illustrate, in exemplificative form, specific embodiments of the present invention. Direction related terminology mentioned in the present invention, such as "up", "down", "front", "rear", "left", "right", "internal", "external" and "sideward", are directions identified in the sheets of drawings. Thus, the use of the direction related terminology is for the purposes of explanation and understanding of the present invention in a better and clear way only and is not intended to limit the scope of the present invention. Further, through- out the various sheets of drawings, elements that have similar structures or are identical are designated with the same reference characters.

Figure 2:
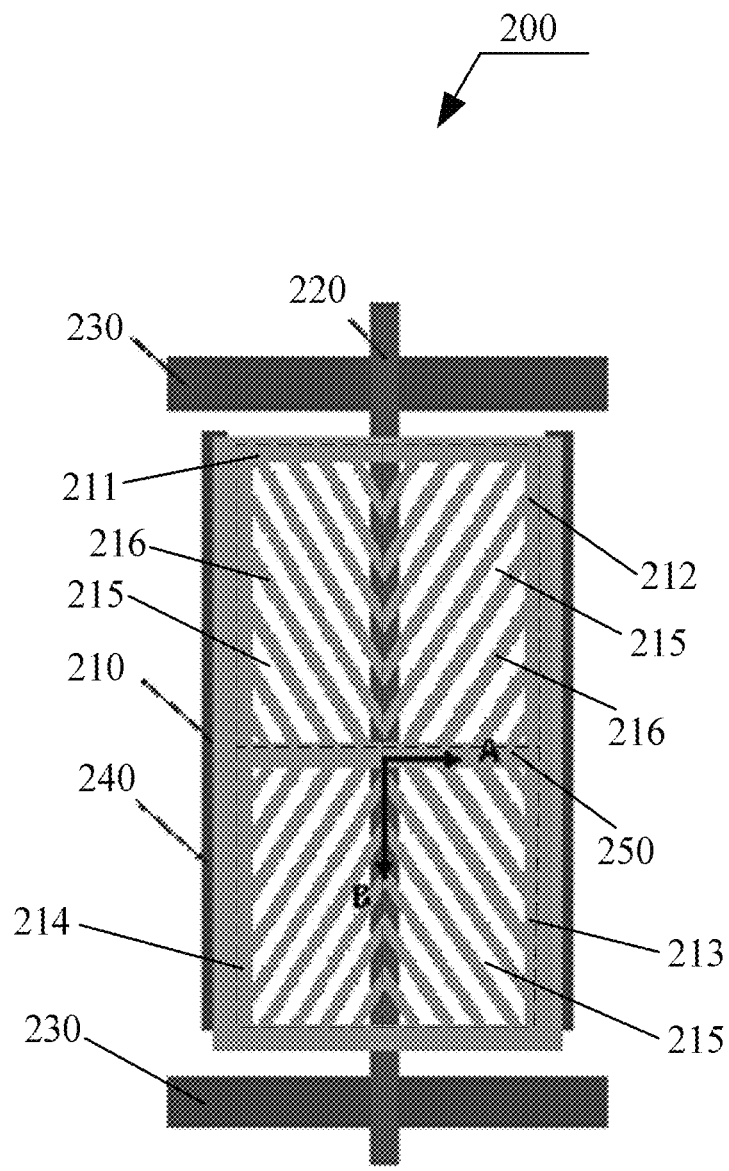
FIG. 2 is a schematic view showing an illustrative example of a pixel structure according to a first embodiment of the present invention.

Referring to FIG. 2, FIG. 2 is a schematic view showing an illustrative example of a pixel structure according to a first embodiment of the present invention. As shown in FIG. 2, the pixel structure 200 comprises a plurality of pixel electrodes 210, a plurality of data lines 220, a plurality of gate lines 230, and a plurality of pixel common electrodes 240. Each of the data lines 220 is located beneath a corresponding one of the pixel electrodes 210 and is perpendicular to the gate lines 230. The pixel common electrodes 240 are arranged on two opposite sides of each of the pixel electrode 210 and are parallel to the data line 220. In this arrangement, the material that makes the pixel common electrodes 240 is on the same metal layer as the gate lines 230.

For easy explanation and illustration, as shown in FIG. 2, in an illustrative example of the instant embodiment, description will be given to an example of which the number of the pixel electrode 210 involved is one for illustration.

In the embodiment of the present invention, each of the pixel electrodes 210, as a whole, is in the form of a rectangular plate that is located between two pixel common electrodes 240. The pixel electrode 210 is divided into two, upper and lower, pixel domains by a pixel electrode trunk 250. Preferably, each pixel electrode 210 is divided by the pixel electrode trunk 250 into two pixel domains that are symmetric in a vertical direction. In other others, the two pixel domains are symmetric in the vertical direction with respect to the pixel electrode trunk 250.

The data line 220 is arranged beneath the pixel electrode 210 and is perpendicular to the pixel electrode trunk 250. The data line 220 functions to transmit a grey level signal and the pixel electrode 210 drives the pixel in response to the grey level signal. The pixel electrode 210 is divided by the data line 220 into two, left and right, pixel domains, and preferably, each pixel electrode 210 is divided by the data line 220 into two pixel domains that are symmetric in a horizontal direction. In other words, the two pixel domains are symmetric with respect to the data line 220. In the embodiment of the present invention, since the data line 220 and the pixel electrode trunk 250 are perpendicular to each other, each pixel electrode 210 is divided by the data line 220 and the pixel electrode trunk 250 into four sub-pixel domains (as indicated by phantom lines of FIG. 1), which are respectively referred to as a first sub-pixel domain 211, a second sub-pixel domain 212, a third sub-pixel domain 213, and a fourth sub-pixel domain 214.

In the embodiment of the present invention, the first sub-pixel domain 211 and the second sub-pixel domain 212 are symmetric with respect to the data line 220; and the third sub-pixel domain 213 and the fourth sub-pixel domain 214 are symmetric with respect to the data line 220. The first sub-pixel domain 211 and the third sub-pixel domain 213 are symmetric with respect to the pixel electrode trunk 250; and the second sub-pixel domain 212 and the fourth sub-pixel domain 214 are symmetric with respect to the pixel electrode trunk 250.

The first sub-pixel domain 211, the second sub-pixel domain 212, the third sub-pixel domain 213, and the fourth sub-pixel domain 214 are each, as a whole, in the form of a rectangular plate but not limited thereto. In the embodiment of the present invention, the first sub-pixel domain 211, the second sub-pixel domain 212, the third sub-pixel domain 213, and the fourth sub-pixel domain 214 are each provided with a plurality of slits 215. The plurality of slits 215 separate each of the sub-pixel domains into a plurality of strip-like separated tabs 216 in such a way that the plurality of slits 215 and the plurality of separated tabs 216 are arranged and distributed alternately. Preferably, the plurality of slits 215 has open widths that are identical, meaning the distance between any two adjacent ones of the separated tabs 216 is identical; and the plurality of separated tabs 216 has widths that are identical, meaning the distance between any two adjacent ones of the slits 215 is identical.

Preferably, in the embodiment of the present invention, the slits 215 of the first sub-pixel domain 211 and the corresponding slits 215 of the second sub-pixel domain 212 are jointed to and in communication with each other at locations above the data line 220 and are symmetric with respect to the data line 220; the separated tabs 216 of the first sub-pixel domain 211 and the corresponding separated tabs 216 of the second sub-pixel domain 212 are connected to each other at locations above the data line 220 and are symmetric with respect to the data line 220. The slits 215 of the third sub-pixel domain 213 and the corresponding slits 215 of the fourth sub-pixel domain 214 are jointed to and in communication with each other at locations above the data line 220 and are symmetric with respect to the data line 220; the separated tabs 216 of the third sub-pixel domain 213 are connected to the corresponding separated tabs 216 of the fourth sub-pixel domain 214 at locations above the data line 220 and are symmetric with respect to the data line 220. The first sub-pixel domain 211 and the third sub-pixel domain 213 are symmetric with respect to the pixel electrode trunk 250 so that the slits 215 and the separated tabs 216 of the first sub-pixel domain 211 and the slits 215 and the separated tabs 216 of the third sub-pixel domain 213 respectively corresponding thereto are symmetric with respect to the pixel electrode trunk 250; the second sub-pixel domain 212 and the fourth sub-pixel domain 214 are symmetric with respect to the pixel electrode trunk 250 so that the slits 215 and the separated tabs 216 of the second sub-pixel domain 212 and the slits 215 and the separated tabs 216 of the fourth sub-pixel domain 214 respectively corresponding thereto are symmetric with respect to the pixel electrode trunk 250.

In the embodiment of the present invention, since the slits 215 of the first sub-pixel domain 211 and the corresponding slits 215 of the second sub-pixel domain 212 are jointed to and in communication with each other at locations above the data line 220 and the slits 215 of the third sub-pixel domain 213 and the corresponding slits 215 of the fourth sub-pixel domain 214 are jointed to and in communication with each other at locations above the data line 220, the interfacing between the first sub-pixel domain 211 and the second sub-pixel domain 212 and the interfacing between the third sub-pixel domain 213 and the fourth sub-pixel domain 214 that are located above the data line 220 both is composed of alternately arranged slits having a predetermined width. Thus, the overlapping area between the data line 220 and the pixel electrode 210 located above the data line 220 is reduced. This reduces parasitic capacitance between the data line 220 and the pixel electrode 210 and also alleviates V-crosstalk of a grey-background white-frame image.

The gate lines 230 function to transmit a gate signal. In the embodiment of the present invention, the gate lines 230 are arranged at two opposite ends of the pixel electrode 210 (namely parallel to a short side direction of the pixel electrode 210) and are spaced from the pixel electrode 210 by a predetermined distance. The gate line 230 at the two opposite ends of the pixel electrode 210 are parallel to each other and are perpendicular to the data line 220 and the pixel common electrode 240. The gate lines 230 are on the same metal layer as the material that makes the pixel common electrode 240.

The pixel common electrodes 240 supply a common electrode voltage to the pixel. In the embodiment of the present invention, the pixel common electrodes 240 are arranged at the other two opposite ends of the pixel electrode 210 (namely parallel to a long side direction of the pixel electrode 210) and partly and respectively overlap edge portions of the two opposite ends of the pixel electrode 210. The pixel common electrodes 240 on the two opposite ends of the pixel electrode 210 are parallel to each other and are located beneath the pixel electrode 210. In the embodiment of the present invention, each of the pixel common electrodes 240 has two opposite ends that are respectively spaced from the gate lines 230 by a predetermined distance. An imaginary extension line of each pixel common electrode 240 is perpendicular to the gate lines 230. Preferably, the two pixel common electrodes 240 are parallel with the data line 220 and are symmetric with respect to an axis of the data line 220.

Figure 3:
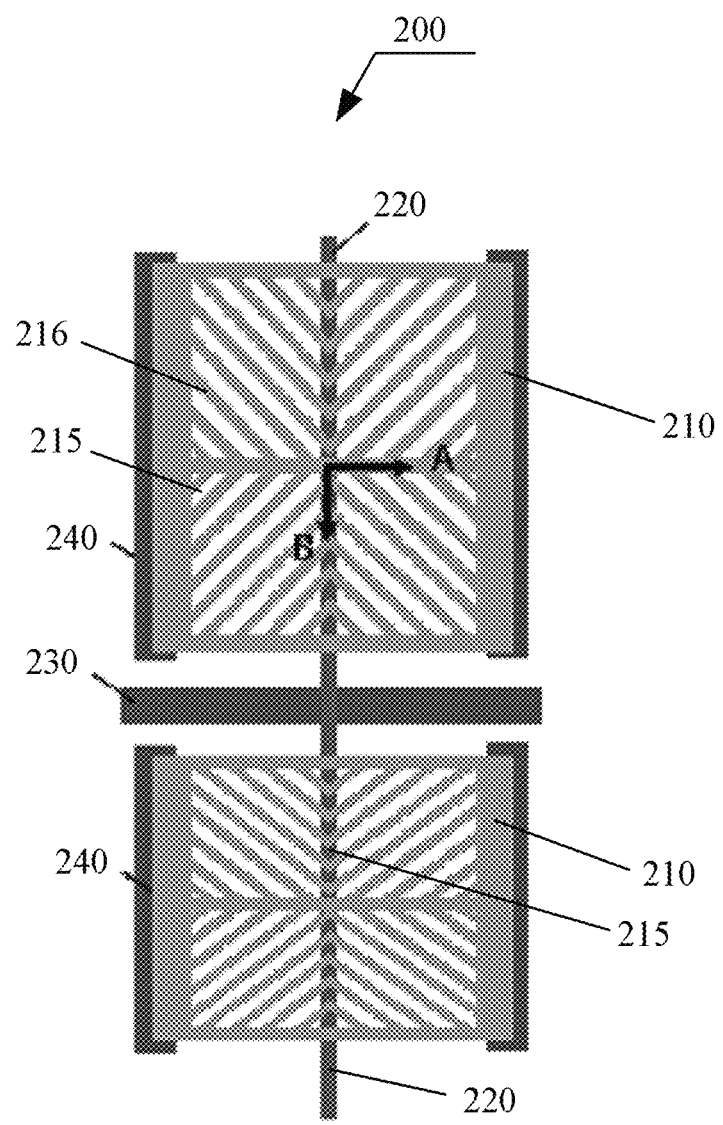
FIG. 3 is a schematic view showing another illustrative example of the pixel structure according to the first embodiment of the present invention.

It is appreciated that the number of the pixel electrode 210 can be two. Referring to FIG. 3, FIG. 3 is a schematic view showing another illustrative example of the pixel structure according to the first embodiment of the present invention. In the instant embodiment, description will be given to an example in which the number of the pixel electrode 210 involved is two for illustration.

In the embodiment, two pixel electrodes 210 are arranged side by side on the same plane and are spaced from each other by a predetermined distance. The data line 220 is located beneath the pixel electrodes 210 and the gate line 230 is located between the two pixel electrodes 210 and is spaced from the two pixel electrodes 210 by a predetermined distance and is perpendicular to the data line 220. Each of the pixel electrodes 210 is divided by the data line 220 and a pixel electrode trunk 250 into four sub-pixel domains, which are respectively a first sub-pixel domain 211, a second sub-pixel domain 212, a third sub-pixel domain 213, and a fourth sub-pixel domain 214.

In the instant embodiment, each of the pixel electrodes 210 has two opposite ends (namely parallel to the long side direction of the pixel electrode 210) that are provided with pixel common electrodes 240 and the pixel common electrodes 240 are located beneath the pixel electrode 210 and are respectively and partly overlap the edge portions of the two opposite ends of the pixel electrode 210. The pixel common electrode 240 on the two opposite ends of the pixel electrode 210 are parallel to each other and the ends of the pixel common electrodes 240 are spaced from the gate line 230 so that a predetermined distance is present therebetween. Imaginary extension lines of the pixel common electrodes 240 are perpendicular to the gate line 230. Preferably, the two pixel common electrodes 240 are parallel with the data line 220 and are symmetric with respect to an axis of the data line 220. The gate line 230 is on the same metal layer as the material that makes the pixel common electrodes 240.

Figure 4:
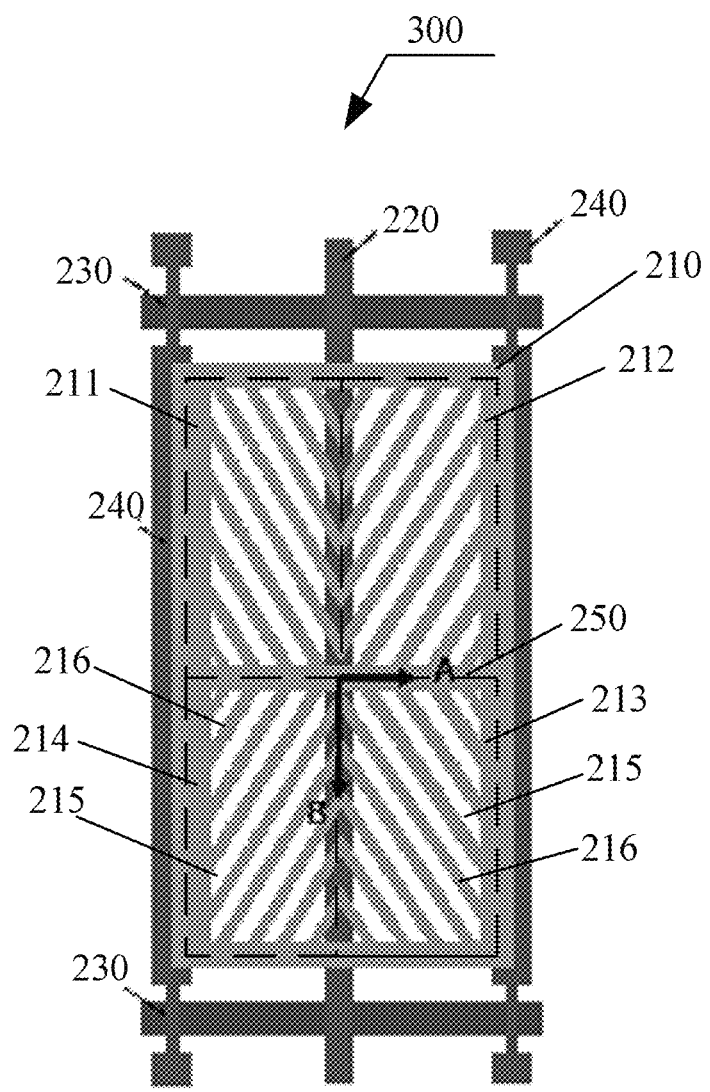
FIG. 4 is a schematic view showing an illustrative example of a pixel structure according to a second embodiment of the present invention.

Referring to FIG. 4, FIG. 4 is a schematic view showing an illustrative example of a pixel structure according to a second embodiment of the present invention. As shown in FIG. 4, for easy explanation and illustration, in the instant embodiment, description will be given to an example of which the number of the pixel electrode involved is one for illustration. In the embodiment of the present invention, the structure of the pixel structure 300 of the instant embodiment is the same as the structure of the pixel structure 200 shown in FIG. 2, where the pixel structure 300 comprises a pixel electrode 210, a data line 220, two gate lines 230, and two pixel common electrodes 240; the data line 220 is located beneath the pixel electrode 210 and is perpendicular to the gate lines 230; the pixel common electrodes 240 are located at two opposite sides of the pixel electrode 210 and are parallel to the data line 220; and the pixel common electrodes 240 are located beneath the pixel electrode 210 and are respectively and partly overlap edge portions of the two opposite ends of the pixel electrode 210.

A difference between the pixel structure 300 of the instant embodiment and the pixel structure 200 shown in FIG. 2 is that the material that makes the pixel common electrodes 240 is not on the same metal layer as the gate lines 230 and under this condition, the pixel common electrodes 240 extend across the gate lines 230 and partly overlap the pixel electrode 210.

Figure 5:
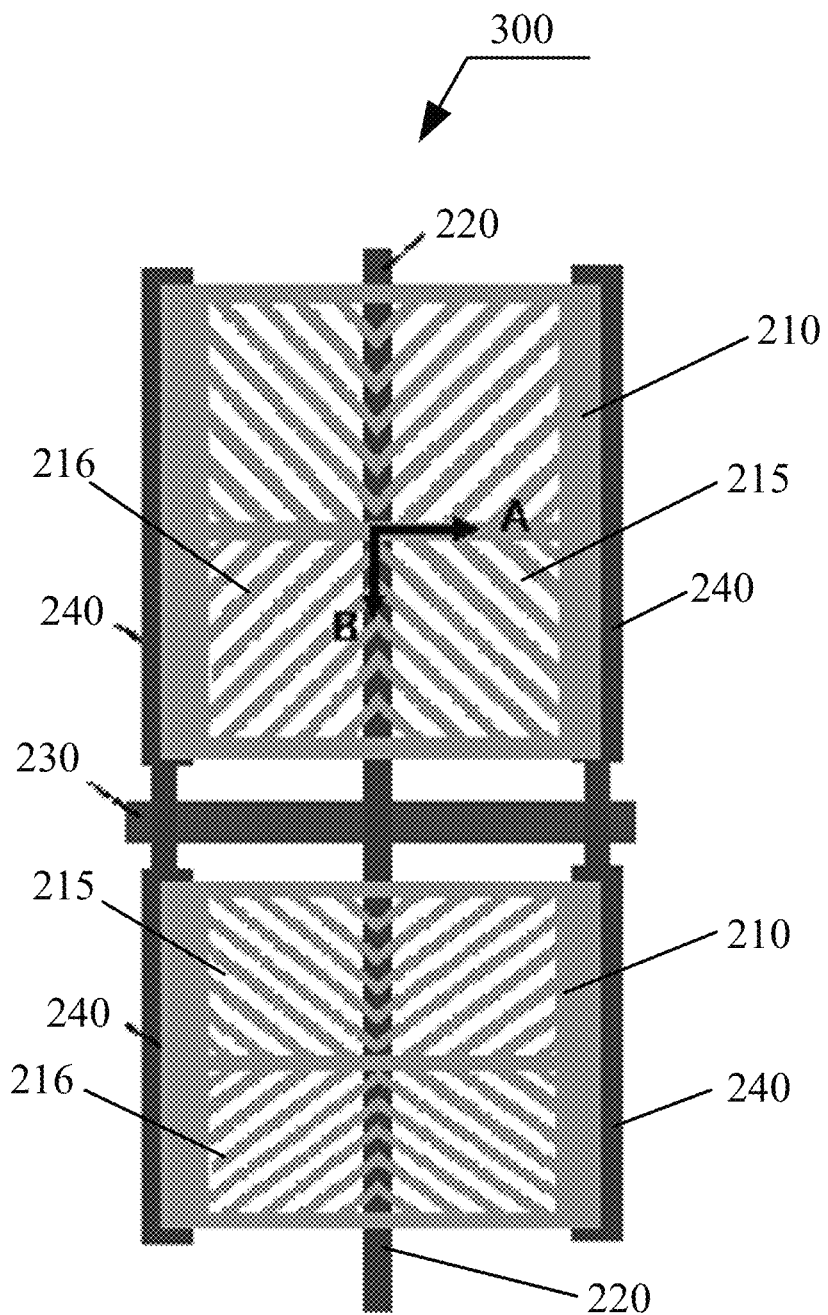
FIG. 5 is a schematic view showing another illustrative example of the pixel structure according to the second embodiment of the present invention.

It is appreciated that the number of the pixel electrode 210 can be two. Referring to FIG. 5, FIG. 5 is a schematic view showing another illustrative example of the pixel structure according to the second embodiment of the present invention. In the instant embodiment, description will be given to an example in which the number of the pixel electrode 210 involved is two for illustration.

In the embodiment, two pixel electrodes 210 are arranged side by side on the same plane and are spaced from each other by a predetermined distance. The data line 220 is located beneath the pixel electrodes 210 and the gate line 230 is located between the two pixel electrodes 210 and is spaced from the two pixel electrodes 210 by a predetermined distance and is perpendicular to the data line 220. The material that makes the pixel common electrodes 240 is not on the same metal layer as the gate line 230 and under this condition, the pixel common electrodes 240 extend across the gate lines 230 and partly overlap the pixel electrodes 210.

Figure 6:
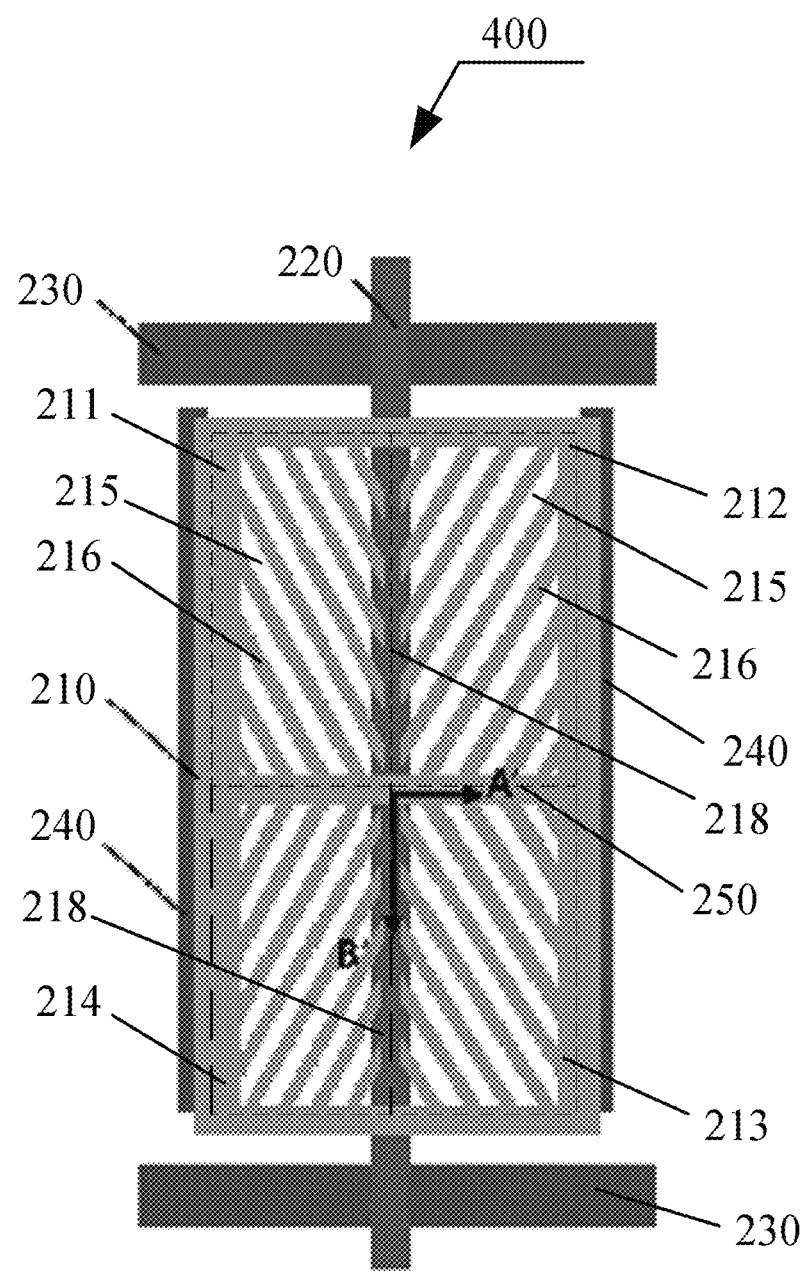
FIG. 6 is a schematic view showing an illustrative example of a pixel structure according to a third embodiment of the present invention.

Referring to FIG. 6, FIG. 6 is a schematic view showing an illustrative example of a pixel structure according to a third embodiment of the present invention. As shown in FIG. 6, for easy explanation and illustration, in the instant embodiment, description will be given to an example of which the number of the pixel electrode involved is one for illustration. In the embodiment of the present invention, the structure of the pixel structure 400 of the instant embodiment is essentially the same as the structure of the pixel structure 200 shown in FIG. 2, where the pixel structure 400 comprises a pixel electrode 210, a data line 220, two gate lines 230, and two pixel common electrodes 240; the data line 220 is located beneath the pixel electrode 210 and is perpendicular to the gate lines 230; the pixel common electrodes 240 are located at two opposite sides of the pixel electrode 210 and are parallel to the data line 220; and the pixel common electrodes 240 are located beneath the pixel electrode 210 and are respectively and partly overlap edge portions of the two opposite ends of the pixel electrode 210.

A difference between the pixel structure 400 of the instant embodiment and the pixel structure 200 shown in FIG. 2 is that the separated tabs 216 of the first sub-pixel domain 211 and the corresponding separated tabs 216 of the second sub-pixel domain 212 are not connected to each other at locations above the data line 220 and the separated tabs 216 of the third sub-pixel domain 213 and the corresponding separated tabs 216 and the fourth sub-pixel domain 214 are not connected to each other at locations above the data line 220. In other words, since the separated tabs 216 of the first sub-pixel domain 211 and the corresponding separated tabs 216 of the second sub-pixel domain 212 are disconnected from each other at locations above the data line 220 and the separated tabs 216 of the third sub-pixel domain 213 and the corresponding separated tabs 216 of the fourth sub-pixel domain 214 are disconnected from each other at locations above the data line 220, the pixel electrode 210 comprises two, upper and lower, openings 218 extending in a lengthwise direction of the data line 220 and located above the data line 220 and the two upper and lower the openings 218 are separated from each other by the pixel electrode trunk 250. Thus, since the pixel electrode 210 comprises the openings 218 formed at locations corresponding to the data line 220, the overlapping area between the data line 220 and the pixel electrode 210 located above the data line 220 is reduced. This reduces parasitic capacitance between the data line 220 and the pixel electrode 210 and also alleviates V-crosstalk of a grey-background white-frame image.

Figure 7:
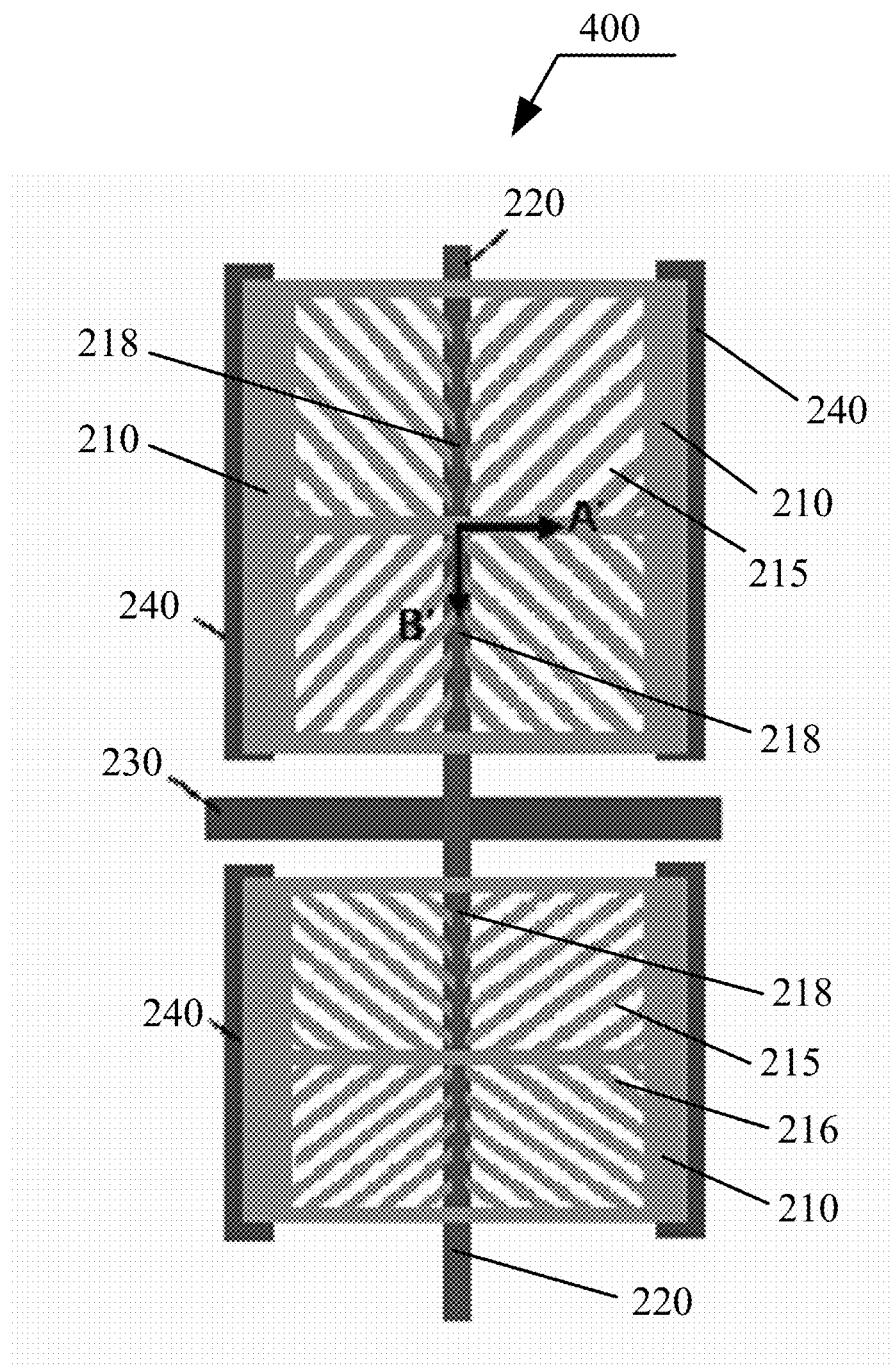
FIG. 7 is a schematic view showing another illustrative example of the pixel structure according to the third embodiment of the present invention.

It is appreciated that the number of the pixel electrode 210 can be two. Referring to FIG. 7, FIG. 7 is a schematic view showing another illustrative example of the pixel structure according to the third embodiment of the present invention. In the instant embodiment, description will be given to an example in which the number of the pixel electrode 210 involved is two for illustration.

In the embodiment, two pixel electrodes 210 are arranged side by side on the same plane and are spaced from each other by a predetermined distance. The data line 220 is located beneath the pixel electrodes 210 and the gate line 230 is located between the two pixel electrodes 210 and is spaced from the two pixel electrodes 210 by a predetermined distance and is perpendicular to the data line 220. Each of the pixel electrodes 210 has two opposite ends (namely parallel to the long side direction of the pixel electrode 210) that are provided with pixel common electrodes 240 and the pixel common electrodes 240 are located beneath the pixel electrode 210 and are respectively and partly overlap the edge portions of the two opposite ends of the pixel electrode 210. The pixel common electrode 240 on the two opposite ends of the pixel electrode 210 are parallel to each other and the ends of the pixel common electrodes 240 are spaced from the gate line 230 so that a predetermined distance is present therebetween. Imaginary extension lines of the pixel common electrodes 240 are perpendicular to the gate line 230. The two pixel common electrodes 240 are parallel with the data line 220 and are symmetric with respect to an axis of the data line 220. The gate line 230 is on the same metal layer as the material that makes the pixel common electrodes 240.

Figure 8:
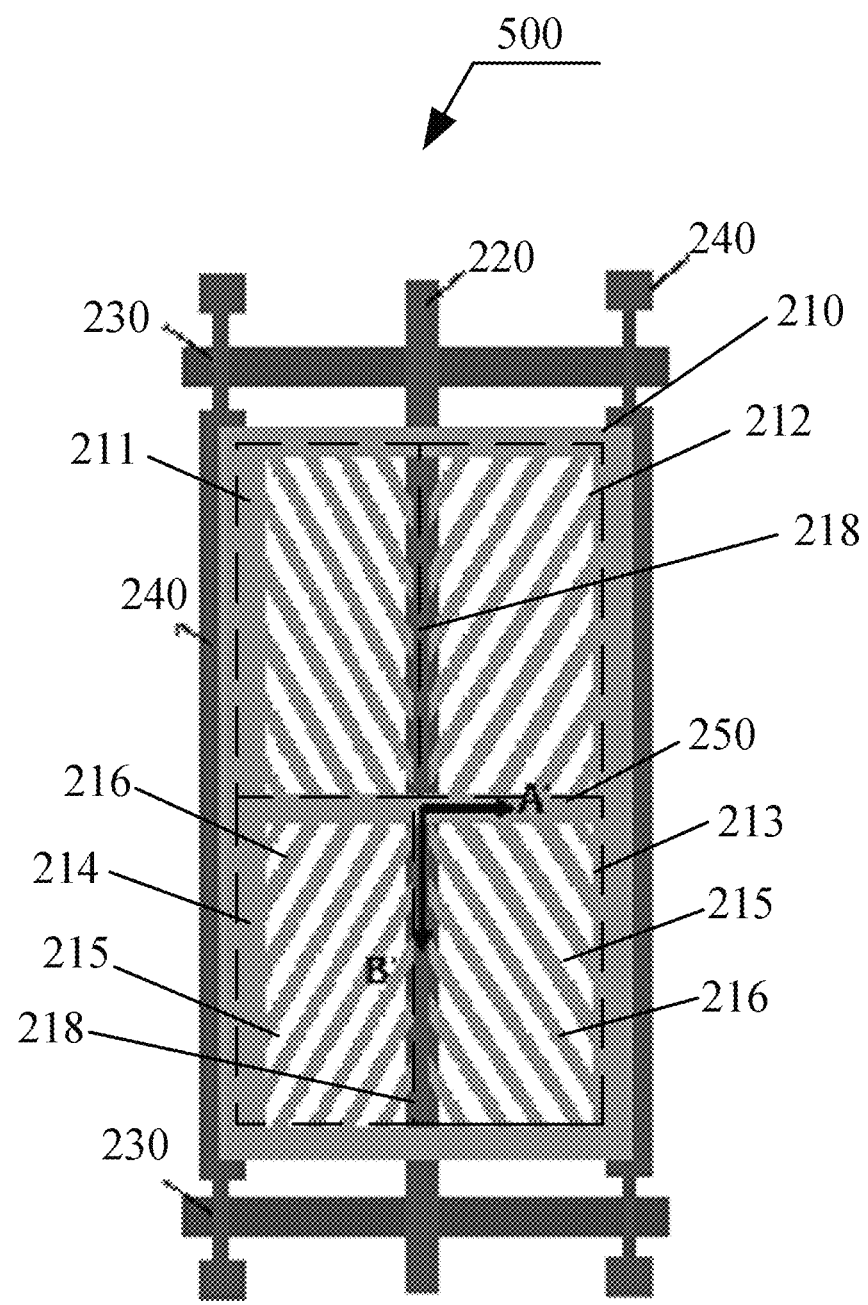
FIG. 8 is a schematic view showing an illustrative example of a pixel structure according to a fourth embodiment of the present invention.

Referring to FIG. 8, FIG. 8 is a schematic view showing an illustrative example of a pixel structure according to a fourth embodiment of the present invention. As shown in FIG. 8, for easy explanation and illustration, in the instant embodiment, description will be given to an example of which the number of the pixel electrode involved is one for illustration. In the embodiment of the present invention, the structure of the pixel structure 500 of the instant embodiment is the same as the structure of the pixel structure 400 shown in FIG. 6, where the pixel structure 500 comprises a pixel electrode 210, a data line 220, two gate lines 230, and two pixel common electrodes 240; the data line 220 is located beneath the pixel electrode 210 and is perpendicular to the gate lines 230; the pixel common electrodes 240 are located at two opposite sides of the pixel electrode 210 and are parallel to the data line 220; and the pixel common electrodes 240 are located beneath the pixel electrode 210 and are respectively and partly overlap edge portions of the two opposite ends of the pixel electrode 210.

A difference between the pixel structure 500 of the instant embodiment and the pixel structure 400 shown in FIG. 6 is that the material that makes the pixel common electrodes 240 is not on the same metal layer as the gate lines 230 and under this condition, the pixel common electrodes 240 extend across the gate lines 230 and partly overlap the pixel electrode 210.

Figure 9:
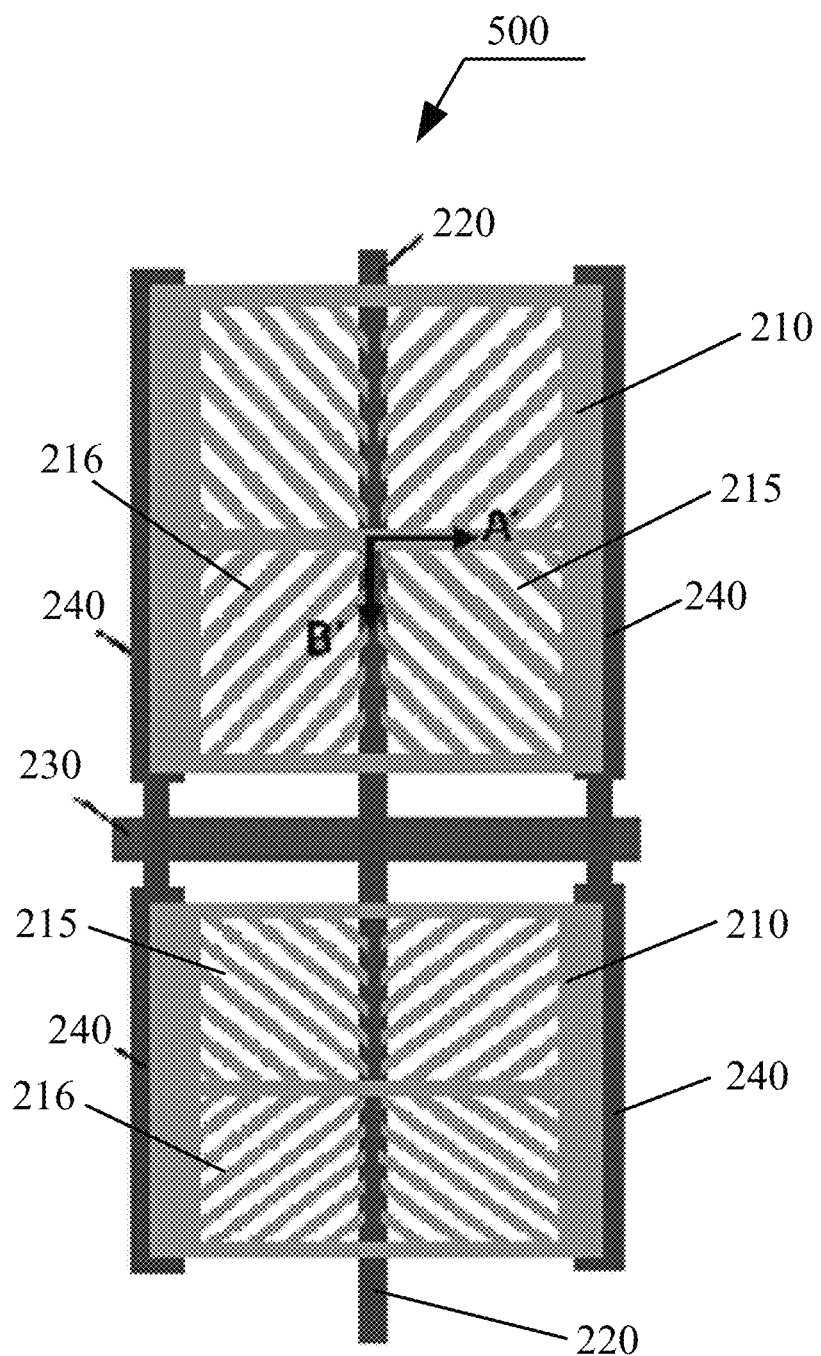
FIG. 9 is a schematic view showing another illustrative example of the pixel structure according to the fourth embodiment of the present invention.

It is appreciated that the number of the pixel electrode 210 can be two. Referring to FIG. 9, FIG. 9 is a schematic view showing another illustrative example of the pixel structure according to the fourth embodiment of the present invention. In the instant embodiment, description will be given to an example in which the number of the pixel electrode 210 involved is two for illustration.

In the embodiment, two pixel electrodes 210 are arranged side by side on the same plane and are spaced from each other by a predetermined distance. The data line 220 is located beneath the pixel electrodes 210 and the gate line 230 is located between the two pixel electrodes 210 and is spaced from the two pixel electrodes 210 by a predetermined distance and is perpendicular to the data line 220. The material that makes the pixel common electrodes 240 is not on the same metal layer as the gate line 230 and under this condition, the pixel common electrodes 240 extend across the gate lines 230 and partly overlap the pixel electrodes 210.

Further, when the interfacing between the first sub-pixel domain 211 and the second sub-pixel domain 212 and the interfacing between the third sub-pixel domain 213 and the fourth sub-pixel domain 214 that are above the data line 220 are formed to be alternately arranged slits of predetermined widths or openings 218 formed along the length of the data line, the pixel structure can be of non-CFA (color filter on array) and color resists are formed on a color filter side of an upper substrate or alternatively, the pixel structure can be CFA and color resists are formed on the thin-film transistor (TFT) side of a lower substrate.

It is appreciated that in the embodiments of the present invention, the number of sub-pixel domains included in each pixel electrode comprises is not limited to four and may alternatively be 2, 6, or 8, or other numbers and the structure of each of the sub-pixel domains is similar to that of the sub-pixel domains described above with reference to the second to fourth embodiments.

In summary, the embodiments of the present invention provide a pixel structure, in which the interfacing between a first sub-pixel domain 211 and a second sub-pixel domain 212 and the interfacing between a third sub-pixel domain 213 and a fourth sub-pixel domain 214 that are located above a data line 220 are formed of alternately arranged slits of predetermined widths or the pixel electrode 210 located above the data line 220 comprises two strip-like openings 218 formed in upper and lower portions thereof to extend in the lengthwise direction of the data line. Thus, the overlapping area between the data line 220 and the pixel electrode 210 located above the data line 220 is reduced. This reduces parasitic capacitance between the data line 220 and the pixel electrode 210 and also alleviates V-crosstalk of a grey-background white-frame image.

Another embodiment of the present invention provides a liquid crystal display. The liquid crystal display comprises a gate driving circuit (not shown), a data driving circuit (not shown), and the pixel structure described in the above embodiments. The pixel structure comprises a plurality of pixel electrodes 210, a plurality of data lines 220, a plurality of gate lines 230, and a plurality of pixel common electrodes 240. The data line 220 is located beneath the corresponding pixel electrode 210 and is perpendicular to the gate line 230. Each of the pixel electrodes 210 has two opposite sides each provided with a pixel common electrode 240. The pixel common electrode 240 is parallel to the data line 220. The material that makes the pixel common electrode 240 is on the same metal layer as the gate line 230, or they are on different metal layers.

The gate driving circuit generates a gate signal. The gate line 230 is electrically connected to the gate driving circuit for transmitting the gate signal. The data driving circuit generates a grey level signal. The data line 220 is electrically connected to data driving circuit for transmitting the grey level signal. The pixel electrode 210 drives the pixel in response to the grey level signal.

It is appreciated that the liquid crystal display and the pixel structure are applicable to any product or component having a displaying function, such as an electronic paper, a liquid crystal television, a mobile phone, a digital picture frame, and a tablet computer.

The present invention provides a liquid crystal display, in which since the interfacing between a first sub-pixel domain 211 a the second sub-pixel domain 212 and the interfacing between a third sub-pixel domain 213 and a fourth sub-pixel domain 214 that are located above a data line 220 are formed as alternatively arranged slits having a predetermined width or the pixel electrode 210 located above the data line 220 comprises two strip-like openings 218 extending in the lengthwise direction of the data line 220 to be located at upper and lower sides. Thus, the overlapping area between the data line 220 and the pixel electrode 210 located above the data line 220 is reduced. This reduces parasitic capacitance between the data line 220 and the pixel electrode 210 and also alleviates V-crosstalk of a grey-background white-frame image. Further, when the liquid crystal display panel displays normally, disclination line caused by poor direction guidance of liquid crystal molecules in the interfacing between the sub-pixel domains and the edge portions of the pixel electrode can be shielded by the data line to become invisible.

The above illustrates only a preferred embodiment according to the present invention and is not intended to limit the scope of right of the present invention. Those having ordinary skills of the art would appreciate that various equivalent modifications that achieve all or some of the operations of the above-described embodiment and fall within scope of the attached claims are considered within the scope covered by the present invention.

What is claimed is:

1. A pixel structure, comprising a plurality of pixel electrodes, a plurality of data lines, and a plurality of gate lines, each of the pixel electrodes having two opposite ends that are each provided with one of the gate lines, the data lines and the gate lines being perpendicular to each other, wherein each of the pixel electrodes comprises at least two sub-pixel domains, the data lines being located beneath the pixel electrode at interfacing between every two adjacent ones of the sub-pixel domains, the pixel electrodes each comprising a plurality of slits located in the interfacing of the two adjacent ones of the sub-pixel domains, the plurality of slits being in alignment with the data line and located above the data line;

wherein the plurality of slits are each in the form of a void space such that the void spaces are located;

wherein the at least two sub-pixel domains of each of the pixel electrodes comprise a first sub-pixel domain and a second sub-pixel domain, which are symmetric to each other with respect to the data line, the first sub-pixel domain and the second sub-pixel domain being each formed with a plurality of slits, wherein the plurality of slits divide each of the sub-pixel domains into a plurality of separated tabs, the plurality of slits and the plurality of separated tabs being arranged and distributed alternately, and each of the slits of the first sub-pixel domain and a corresponding one of the slits of the second sub-pixel domain are jointed to each other to define one of the void spaces that are located exactly above and in alignment with the data line; and wherein the first and second sub-pixel domains each comprise a vertical trunk located at an outer side of the sub-pixel domain, the two vertical trunks being spaced from and opposite to each other, the separated tabs of each of the first and second sub-pixel domains extending from the vertical trunk thereof in a direction toward each other, each of the tabs of the first sub-pixel domain having a distal end that is distant from the vertical trunk of the first sub-pixel domain, each of the tabs of the second sub-pixel domain corresponding to one of the tabs of the first sub-pixel domain and having a distal end that is distant from the vertical trunk of the second sub-pixel domain and jointed to the distal end of the corresponding one of the tabs of the first sub-pixel domain to form a connection that is located above and in alignment with the data line, wherein the connections of the tabs of the first and second sub-pixel domains and the void spaces are alternate with each other in direction along the data line.

2. The pixel structure as claimed in claim 1, wherein the separated tabs of the first sub-pixel domain are respectively connected to the corresponding separated tabs of the second sub-pixel domain at locations above the data line and being symmetric with respect to the data line such that the connections between the separated tabs of the first sub-pixel domain and the corresponding separated tabs of the second sub-pixel domain are spaced from each other by the void spaces, interfacing between the first sub-pixel domain and the second sub-pixel domain that is above the data line being formed of the connections and the void spaces that alternately arranged.

3. The pixel structure as claimed in claim 1, wherein the plurality of slits of each of the first and second sub-pixel domains have an identical open width and the plurality of separated tabs of each of the first and second sub-pixel domains have an identical width, the plurality of slits and the plurality of separated tabs each of the first and second sub-pixel domains being arranged and distributed alternately and in an equally spaced manner.

4. The pixel structure as claimed in claim 1, wherein the separated tabs of the first sub-pixel domain are disconnected from the corresponding separated tabs of the second sub-pixel domain at locations above the data line, the pixel electrode that is located above the data line comprising strip-like openings formed therein and extending in a lengthwise direction of the data line so as to reduce overlapping area between the data line and the pixel electrode located above the data line.

5. The pixel structure as claimed in claim 1, wherein the pixel structure further comprises a plurality of pixel common electrodes, the pixel electrode having another two opposite ends each provided with one of the pixel common electrodes, each of the pixel common electrodes having two opposite ends that are spaced from the gate lines by a predetermined distance, imaginary extension lines of the pixel common electrodes being perpendicular to the gate lines.

6. The pixel structure as claimed in claim 5, wherein the gate line is on the same metal layer as a material that makes the pixel common electrodes, the pixel common electrodes located at the two opposite ends of the pixel electrode being both parallel to the data line and symmetric with respect to an axis of the data line, the pixel common electrodes being located beneath the pixel electrode.

7. The pixel structure as claimed in claim 5, wherein a material that makes the pixel common electrodes is not on the same metal layer as the gate line, the pixel common electrodes extending across the gate lines and partly overlapping the pixel electrode, the pixel common electrodes located at the two opposite ends of the pixel electrode being both parallel to the data line and symmetric with respect to an axis of the data line, the pixel common electrodes being located beneath the pixel electrode.

8. The pixel structure as claimed in claim 4, wherein when the interfacing between the first sub-pixel domain and the second sub-pixel domain above the data line comprises the void spaces or is formed with the openings extending in the lengthwise direction of the data line, the pixel structure is not color filter on array and color resists are formed on a color filter side of an upper substrate; or
the pixel structure is not color filter on array and color resists are formed on a thin-film transistor side of a lower substrate.

9. A liquid crystal display, comprising:
a gate driving circuit, which generates a gate signal;
a data driving circuit, which generates a grey level signal; and
a pixel structure, which comprises a plurality of pixel electrodes, a plurality of data lines, and a plurality of gate lines, the gate lines being electrically connected to the gate driving circuit to transmit the gate signal, the data lines being electrically connected to the data driving circuit to transmit the grey level signal, the pixel electrode being operable to drive a pixel in response to the grey level signal; wherein each of the pixel electrodes has two opposite ends that are each provided with one of the gate lines, the data lines and the gate lines being perpendicular to each other, each of the pixel electrodes comprising at least two sub-pixel domains, the data lines being located beneath the pixel electrode at interfacing between every two adjacent ones of the sub-pixel domains, the pixel electrodes each comprising a plurality of slits located in the interfacing of the two adjacent ones of the sub-pixel domains, the plurality of slits being in alignment with the data line and located above the data line;
wherein the plurality of slits are each in the form of a void space such that the void spaces are located exactly above and in alignment with the data line;
wherein the at least two sub-pixel domains of each of the pixel electrodes comprise a first sub-pixel domain and a second sub-pixel domain, which are symmetric to each other with respect to the data line, the first sub-pixel domain and the second sub-pixel domain being each formed with a plurality of slits, wherein the plurality of slits divide each of the sub-pixel domains into a plurality of separated tabs, the plurality of slits and the plurality of separated tabs being arranged and distributed alternately, and each of the slits of the first sub-pixel domain and a corresponding one of the slits of the second sub-pixel domain are jointed to each other to define one of the void spaces that are located exactly above and in alignment with the data line; and wherein the first and second sub-pixel domains each comprise a vertical trunk located at an outer side of the sub-pixel domain, the two vertical trunks being spaced from and opposite to each other, the separated tabs of each of the first and second sub-pixel domains extending from the vertical trunk thereof in a direction toward each other, each of the tabs of the first sub-pixel domain having a distal end that is distant from the vertical trunk of the first sub-pixel domain, each of the tabs of the second sub-pixel domain corresponding to one of the tabs of the first sub-pixel domain and having a distal end that is distant from the vertical trunk of the second sub-pixel domain and jointed to the distal end of the corresponding one of the tabs of the first sub-pixel domain to form a connection that is located above and in alignment with the data line, wherein the connections of the tabs of the first and second sub-pixel domains and the void spaces are alternate with each other in direction along the data line.

10. The liquid crystal display as claimed in claim 9, wherein the separated tabs of the first sub-pixel domain are respectively connected to the corresponding separated tabs of the second sub-pixel domain at locations above the data line and being symmetric with respect to the data line such that the connections between the separated tabs of the first sub-pixel domain and the corresponding separated tabs of the second sub-pixel domain are spaced from each other by the void spaces, interfacing between the first sub-pixel domain and the second sub-pixel domain that is above the data line being formed of the connections and the void spaces that alternately arranged slits.

11. The liquid crystal display as claimed in claim 9, wherein the plurality of slits of each of the first and second sub-pixel domains have an identical open width and the plurality of separated tabs of each of the first and second sub-pixel domains have an identical width, the plurality of slits and the plurality of separated tabs each of the first and second sub-pixel domains being arranged and distributed alternately and in an equally spaced manner.

12. The liquid crystal display as claimed in claim 9, wherein the separated tabs of the first sub-pixel domain are disconnected from the corresponding separated tabs of the second sub-pixel domain at locations above the data line, the pixel electrode that is located above the data line comprising strip-like openings formed therein and extending in a lengthwise direction of the data line so as to reduce overlapping area between the data line and the pixel electrode located above the data line.

13. The liquid crystal display as claimed in claim 9, wherein the pixel structure further comprises a plurality of pixel common electrodes, the pixel electrode having another two opposite ends each provided with one of the pixel common electrodes, each of the pixel common electrodes having two opposite ends that are spaced from the gate lines by a predetermined distance, imaginary extension lines of the pixel common electrodes being perpendicular to the gate lines.

14. The liquid crystal display as claimed in claim 13, wherein the gate line is on the same metal layer as a material that makes the pixel common electrodes, the pixel common electrodes located at the two opposite ends of the pixel electrode being both parallel to the data line and symmetric with respect to an axis of the data line, the pixel common electrodes being located beneath the pixel electrode.

15. The liquid crystal display as claimed in claim 13, wherein a material that makes the pixel common electrodes is not on the same metal layer as the gate line, the pixel common electrodes extending across the gate lines and partly overlapping the pixel electrode, the pixel common electrodes located at the two opposite ends of the pixel electrode being both parallel to the data line and symmetric with respect to an axis of the data line, the pixel common electrodes being located beneath the pixel electrode.

16. The liquid crystal display as claimed in claim 12, wherein when the interfacing between the first sub-pixel domain and the second sub-pixel domain above the data line comprises the void spaces or is formed with the openings extending in the lengthwise direction of the data line, the pixel structure is not color filter on array and color resists are formed on a color filter side of an upper substrate; or the pixel structure is not color filter on array and color resists are formed on a thin-film transistor side of a lower substrate.

\* \* \* \* \*